(12) United States Patent
Twynam et al.

(10) Patent No.: US 11,342,451 B2
(45) Date of Patent: May 24, 2022

(54) SEMICONDUCTOR DEVICE AND METHOD OF FABRICATING A SEMICONDUCTOR DEVICE

(71) Applicant: Infineon Technologies AG, Neubiberg (DE)

(72) Inventors: John Twynam, Regensburg (DE); Albert Birner, Regensburg (DE); Helmut Brech, Lappersdorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/697,490

(22) Filed: Nov. 27, 2019

(65) Prior Publication Data
US 2020/0176594 A1    Jun. 4, 2020

(30) Foreign Application Priority Data
Dec. 3, 2018 (EP) .................................. 18209796

(51) Int. Cl.
| | | |
|---|---|---|
| *H01L 29/778* | (2006.01) | |
| *H01L 21/02* | (2006.01) | |
| *H01L 21/265* | (2006.01) | |
| *H01L 29/04* | (2006.01) | |
| *H01L 29/06* | (2006.01) | |

(Continued)

(52) U.S. Cl.
CPC ...... *H01L 29/7786* (2013.01); *H01L 21/0254* (2013.01); *H01L 21/26546* (2013.01); *H01L 29/04* (2013.01); *H01L 29/0684* (2013.01); *H01L 29/1029* (2013.01); *H01L 29/2003* (2013.01); *H01L 29/205* (2013.01); *H01L 29/207* (2013.01); *H01L 29/32* (2013.01); *H01L 29/66462* (2013.01)

(58) Field of Classification Search
CPC ............ H01L 29/7786; H01L 21/0254; H01L 21/26546; H01L 29/0684; H01L 29/1029; H01L 29/2003; H01L 29/205; H01L 29/32; H01L 29/66462; H01L 29/78; H01L 29/808; H01L 29/778; H01L 29/0649; H01L 29/0657; H01L 21/02433; H01L 29/04–045

See application file for complete search history.

(56) References Cited

U.S. PATENT DOCUMENTS

| | | | | |
|---|---|---|---|---|
| 6,160,833 | A * | 12/2000 | Floyd .................... | B82Y 20/00 372/96 |
| 9,601,638 | B2 | 3/2017 | Huang et al. | |

(Continued)

FOREIGN PATENT DOCUMENTS

EP    3333897 A1    6/2018

*Primary Examiner* — Shahed Ahmed
(74) *Attorney, Agent, or Firm* — Murphy, Bilak & Homiller, PLLC

(57) ABSTRACT

A semiconductor device includes a support substrate having a first surface capable of supporting the epitaxial growth of at least one III-V semiconductor and a second surface opposing the first surface, at least one mesa positioned on the first surface, each mesa including an epitaxial III-V semiconductor-based multi-layer structure on the first surface of the support substrate, the III-V semiconductor-based multi-layer structure forming a boundary with the first surface and a parasitic channel suppression region positioned laterally adjacent the boundary.

9 Claims, 7 Drawing Sheets

(51) Int. Cl.
H01L 29/10 (2006.01)
H01L 29/20 (2006.01)
H01L 29/205 (2006.01)
H01L 29/207 (2006.01)
H01L 29/32 (2006.01)
H01L 29/66 (2006.01)

(56) References Cited

U.S. PATENT DOCUMENTS

| | | | |
|---|---|---|---|
| 2007/0085093 A1* | 4/2007 | Ohmae | H01L 33/007 257/89 |
| 2009/0166678 A1 | 7/2009 | Sato et al. | |
| 2010/0117118 A1* | 5/2010 | Dabiran | H01L 29/207 257/190 |
| 2015/0340277 A1* | 11/2015 | Kuehn | H01L 21/76237 257/503 |
| 2015/0357417 A1* | 12/2015 | Basu | H01L 21/02543 257/201 |
| 2016/0260827 A1 | 9/2016 | Nishimori et al. | |
| 2017/0077220 A1* | 3/2017 | Ohara | H01L 29/0615 |

\* cited by examiner

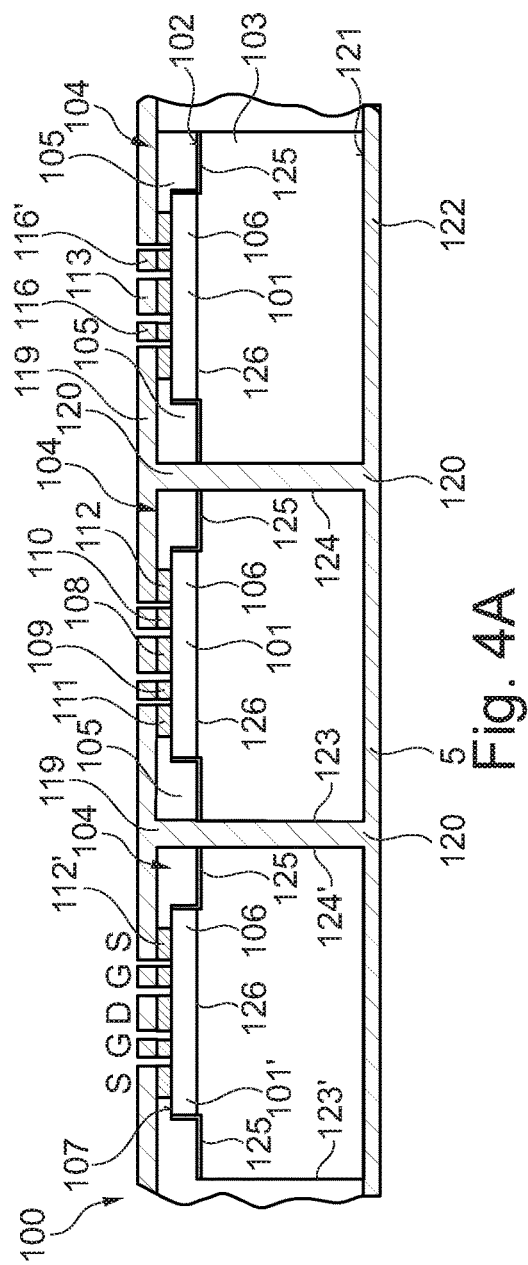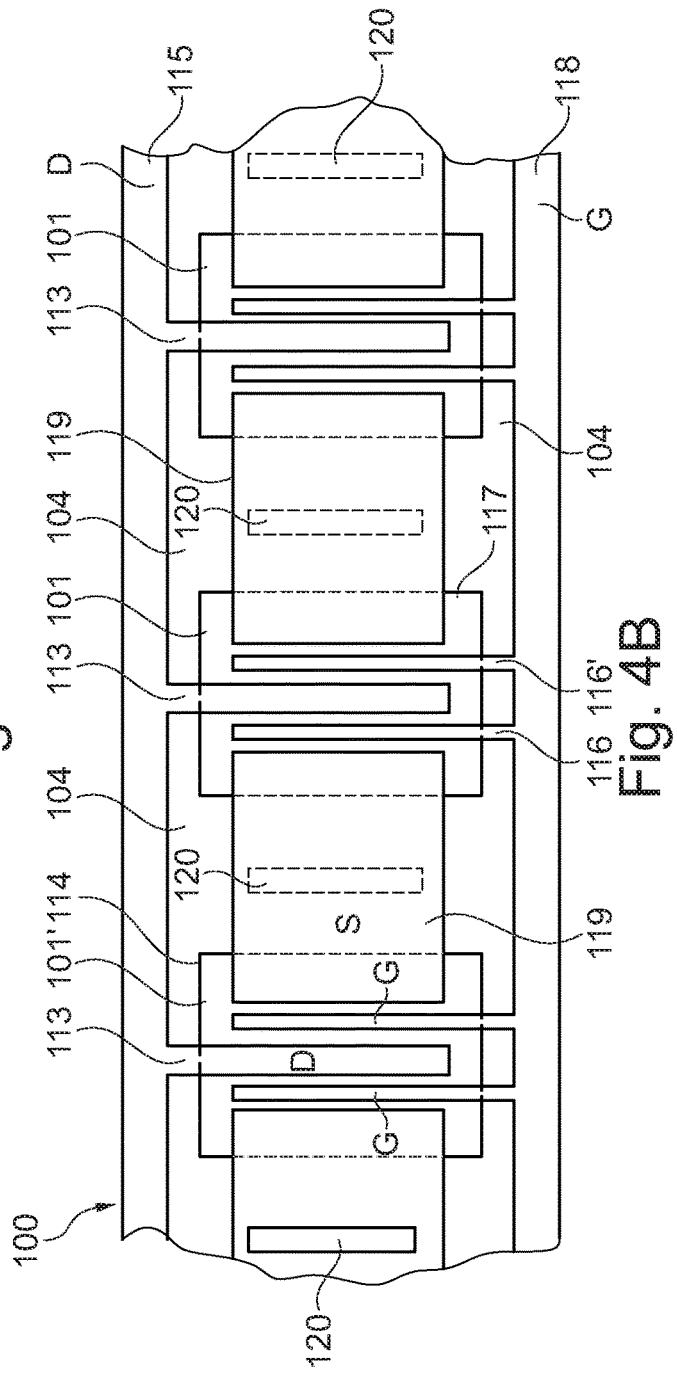

SEMICONDUCTOR DEVICE AND METHOD OF FABRICATING A SEMICONDUCTOR DEVICE

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SIC) power devices have been considered. Group III-N semiconductor devices, such as gallium nitride (GaN) devices, are now emerging as attractive candidates to carry large currents, support high voltages and to provide very low on-resistance and fast switching times. However, further improvements are desirable.

SUMMARY

In an embodiment, a semiconductor device comprises a support substrate having a first surface capable of supporting the epitaxial growth of at least one III-V semiconductor and a second surface opposing the first, surface, at least one mesa positioned on the first surface, each mesa, comprising an epitaxial III-V semiconductor-based, multi-layer structure on the first surface of the support substrate, the III-V semiconductor-based multi-layer structure forming a boundary with the first surface and a parasitic channel suppression region positioned laterally adjacent the boundary.

In an embodiment, a method of fabricating a semiconductor device is provided, the method comprising providing a substrate having a first surface capable of supporting the epitaxial growth of at least one III-V semiconductor layer, epitaxially growing a multilayer III-V semiconductor structure on the first surface, removing regions of the multilayer III-V semiconductor structure and producing at least one mesa, and forming a parasitic channel suppression region at the first surface of the substrate laterally adjacent to the mesa and/or on side faces of the mesas.

Those skilled in the art will recognize additional features and advantages upon reading the following detailed description, and upon viewing the accompanying drawings.

BRIEF DESCRIPTION

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 1 illustrates a semiconductor device according to an embodiment.

FIG. 2, which includes FIGS. 2A to 2F, illustrates a method, of fabricating a semiconductor device.

FIG. 3, which includes FIGS. 3A to 3E, illustrates semiconductor devices according to various embodiments.

FIG. 4A illustrates a cross-sectional view of a semiconductor device including a plurality of mesas.

FIG. 4B illustrates a plan view of a semiconductor device including a plurality of mesas.

DETAILED DESCRIPTION

Figure 1:
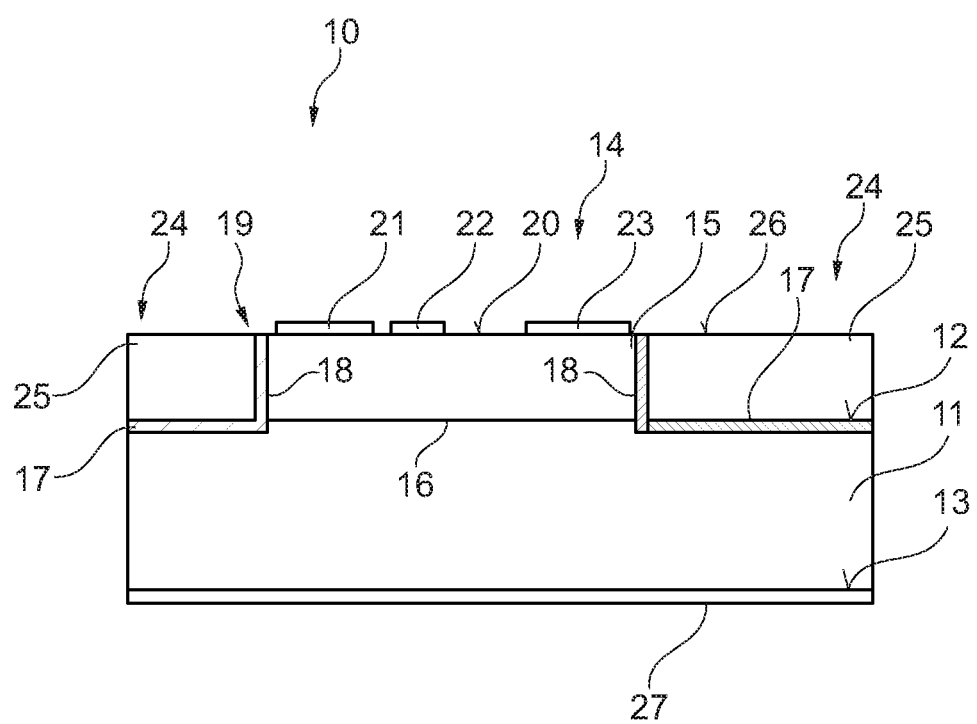

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure (s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction, of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed, in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium, gallium arsenide phosphide nitride ($Al_xIn_yGa_{(1-x-y)}PbN_{(1-a-b)}$), for example. Aluminum gallium nitride and AlGaN refers to an alloy described by the formula $Al_xGa_{(1-x)}N$, where $0<x<1$.

In III-V semiconductor devices, such as GaAs- or GaN-based devices, formed on a foreign substrate such as silicon, a parasitic conductive channel can form at the interface between the substrate and the III-V semiconductor device. Coupling between an electrode of the device, such as a drain electrode in the case of a transistor device, and these parasitic electron or hole channels can lead to losses and limit performance.

In some embodiments, a III-V semiconductor multilayer structure is epitaxially grown on a support substrate comprising a different material and the III-V semiconductor multi-layer structure is patterned to form a plurality of discrete mesas that are speared from one another by regions of the support substrate. These regions of the support substrate may be filled with insulation material that may form a substantially coplanar surface with the upper surface of the mesa. One or more devices, such as a transistor device, are formed in some or all of the mesas on the support substrate. The insulating material may also be used to reduce substrate or wafer bow which may be caused by compressive or tensile stress resulting from the different in lattice parameter between the III-V semiconductor and the support substrate.

Parasitic electron or hole channels may form at the interface between the III-V semiconductor and the insulating material as well as at the interface between the III-V semiconductor and the support substrate.

The present disclosure aims to reduce the effect of these parasitic charge channels by providing a parasitic channel suppression region that hinders or suppresses the mobility of charges at the interface between the insulating material and the support substrate and/or at the interface between the insulating material and the III-V semiconductor, for example at the side faces of a mesa formed by a multi-layer stack of III-V semiconductor layers.

In some embodiments, a parasitic channel suppression region is provided that is highly resistive so that free charges are prevented or hindered from moving. In these embodiments, the parasitic channel suppression provides a charge mobility reduction region. The charge mobility reduction region may include an amorphous layer or region, a polycrystalline layer or region or a high defect layer or region. The charge mobility reduction region may also include a combination of amorphous and/or polycrystalline portions.

In some embodiments, a parasitic channel suppression region is provided that reduces the charge density by providing a charge density reduction region at the side walls of the mesas and/or at the interface between the insulation material and the substrate and, therefore, laterally adjacent to the boundary between the III-V semiconductor and the substrate. The charge density reduction region may include traps for trapping free charges, thus preventing the formation of a parasitic conductive electron or hole channel.

In some embodiments, parasitic channels are suppressed using a combination of charge traps, to reduce the density of free charges, and a highly resistive region to prevent movement of free charges.

Epitaxial Group III nitride-based multilayer structures, such as those described above which are used for HEMTs, have large polarization charges and are epitaxially grown at high temperature. Consequently, the inclusion of a parasitic channel suppression region can be particularly beneficial for Group III nitride-based multilayer structures.

In Group III nitride-based transistors formed on a support substrate comprising a different material, such as silicon, a parasitic conductive electron or hole channel can form at the interface between the substrate and the Group III nitride structure. This parasitic electron or hole channel may be caused by the polarization of the Group III nitride layers to form charges and electrostatic attraction of the charges by the drain electrode of the transistor. Coupling between the drain electrode and these parasitic electron or hole channels can lead to RF losses.

In embodiments in which the Group III nitride transistor devices are formed in mesas that are embedded in an insulator, parasitic electron or hole channels may also form at the interface between the Group III nitride layers and the insulator as well as at the interface between the Group III nitride and the support substrate.

In one aspect, the present disclosure aims to reduce the mobility of mobile charge carriers that exist in the inter-mesa regions by decoupling these parasitic charge channels from the substrate in order to achieve an improvement in efficiency. According to the present disclosure, any mobile charge parasitic channels that are present at the Group III nitride/substrate interface directly beneath the devices formed in the mesas are not directly physically interrupted and the charges are not compensated by adjusting the composition of the layers positioned on the area of this interface, i.e. above and below the interface.

Without being bound by theory, the present disclosure is based on the realisation that bulk and interface positive charges can exist in the insulating regions that surround the mesas comprising the Group III nitride layers and the active transistor device structure. These fixed positive charges induce mobile negative charge in the adjacent semiconductor regions which can have the form of an electron channel in the silicon substrate and in the Group III structure near the boundaries with the insulating layers, i.e. at the side walls of the mesas. These parasitic electron channels are capacitively coupled to the drain electrode and to a conductive electrode, which is typically coupled to ground potential, on the rear side of the substrate. RF losses rise due to RF current flowing between the drain electrode and the substrate through these parasitic electron channels.

In order to reduce the RF losses and improve the efficiency of the device, the present disclosure seeks to suppress the current flow in the parasitic channels by inhibiting the movement of electrons in these parasitic channels. This is achieved in some embodiments by providing a charge mobility reduction region at the side walls of the mesas and/or at the interface between the insulation material and the substrate and, therefore, laterally adjacent to the boundary between the Group III nitride structure and the substrate. The parasitic electron channels are thought to still exit and be capacitively coupled to the drain electrode and the electrode on the rear surface of the substrate. However, the charge mobility reduction region prevents current, flow through the parasitic electron channel so that RF losses do not arise.

The charge mobility reduction region may be a highly resistive region which may be formed by forming an amorphous or polycrystalline or high-defect density region at positions in which the parasitic electron channels are formed, for example at the side walls of the Group III nitride layers of the mesa and/or at the interface between the insulating material and the substrate, for example at the surface of the substrate. The charge mobility reduction region can be formed by implantation and locally disrupt the crystallinity of the substrate and epitaxial Group III nitride layers. An increase in the drain efficiency of at least 4 to 5% points can be achieved. Drain efficiency is the ratio of (RF output power delivered to the load)/(DC power supplied to the transistor drain terminal).

In a second aspect, the present disclosure seeks to suppress the current flow in the parasitic channels by decreasing the charge density at the regions in which these parasitic channels are formed. This is achieved by providing a charge density reduction region at the side walls of the mesas and/or at the interface between the insulation material and the substrate and, therefore, laterally adjacent to the boundary between the Group III nitride structure and the substrate. The charge density reduction region may include traps for trapping the charge, thus preventing the formation of a parasitic conductive electron or hole channel.

The charge density reduction region may be an amorphous or polycrystalline or high-defect density region formed at positions in which the parasitic electron channels are formed, for example at the side walls of the Group III nitride layers of the mesa and/or at the interface between the insulating material and the substrate, for example at the surface of the substrate. The charge density reduction region can be formed by implantation and to locally disrupt the crystallinity of the substrate and epitaxial Group III nitride layers and form charge traps in these regions.

In some embodiments, the channel suppression region may include a combination of a high trap density for reducing the charge density and a locally increased resistivity for reducing charge mobility.

These principles may also be applied to semiconductor materials other than Group III nitrides, for example III-V semiconductor materials.

FIG. 1 illustrates a semiconductor device 10 according to an embodiment. The semiconductor device 10 comprises a support substrate 11 having a first surface 12 capable of supporting the epitaxial growth of at least one III-V semiconductor and a second surface 13 opposing the first surface 12. The semiconductor device 10 includes at least one mesa 14 positioned on the first surface 12. The mesa 14 includes an epitaxial III-V multilayer structure 15 disposed on the first surface 12 of the support substrate 11. The III-V multilayer structure 15 forms a boundary 16 with the first surface 12. The semiconductor device 10 also includes a parasitic channel suppression region 17 which is positioned laterally adjacent the boundary 16.

In some embodiments such as that illustrated in FIG. 1, the III-V semiconductor is a Group III nitride and the III-V multilayer structure 15 is a Group III nitride-based multilayer structure such as a GaN-based multilayer structure.

In some embodiments, the boundary 16 is an interface between the lowermost epitaxial Group ITT nitride-based layer of the epitaxial Group III nitride-based, multilayer structure 15 and the first surface 12 of the support substrate 11. In other embodiments, the boundary 16 has a thickness and forms a boundary region or boundary layer between the first surface 12 and the lowermost epitaxial Group III nitride-based layer. For example, the boundary 16 may include a silicon nitride layer which is arranged between the first surface 12 of the substrate 11 and the lowermost epitaxial Group III nitride layer. In some embodiments, the silicon nitride layer is formed by nitridation of the first surface 12 of a silicon support substrate 11. A first interface is formed between the boundary 16 and the first surface 12 and a second interface is formed between the boundary 16 and the lowermost epitaxial Group III nitride layer.

The support substrate 11 may include a monocrystalline foreign substrate such as a silicon <111> or <110> wafer or a sapphire wafer or a SiC wafer or an epitaxial monocrystalline silicon layer. The support substrate 11 may be a high resistivity silicon substrate with a bulk resistivity of bulk resistivity of greater than 100 Ohm·cm, or greater than 500 Ohm·cm or greater than about 1000 Ohm·cm.

The mesa 14 protrudes from the first surface 12 of the support substrate 11 and has a lateral area that is defined by sidewalls 18 comprising Group III nitride-based material. Each mesa 14 may provide a semiconductor device, such as a transistor device, for example a High Electron Mobility Transistor (HEMT), a MISFET, a MIS-HEMT or a JFET. The transistor device may have an operating frequency of 800 MHz or more. In some embodiments, the mesa may provide a passive device.

The mesa 14 includes a metallisation structure 19 on its upper surface 20. In embodiments in which the semiconductor device 10 is a transistor device, the metallisation structure 19 includes a source electrode 21, a gate electrode 22 and a drain electrode 23, whereby the gate electrode 22 is laterally positioned between the source electrode 21 and the drain electrode 23. In some embodiments, the source electrode 21, the gate electrode 22 and the drain electrode 23 have an elongate strip-like structure and extend substantially parallel to one another. In the cross-sectional view of FIG. 1, the source electrode 21, the gate electrode 22 and the drain electrode 23 extend into the plane of the drawing.

The regions of the first surface 12 positioned between immediately adjacent mesas 14 are non-device areas 24. In some embodiments, the non-device regions 24 may include insulating material 25 so that the side faces 18 of the mesas 14 are embedded in the insulating material 25. The parasitic channel suppression region 17 can, therefore, be arranged in these non-device regions 24 and be positioned between immediately adjacent mesas 14.

In order to reduce RF losses and increase the efficiency of the device 10, the semiconductor device 10 includes the parasitic channel suppression region 17 that is positioned laterally adjacent the boundary 16 between the Group III nitride-based multilayer structure 15 and the first surface 12 of the support, substrate 11. In some embodiments, the parasitic channel suppression region 17 is positioned in the support substrate 11 at the first surface 12 and laterally adjacent the mesa 14.

The parasitic channel suppression region 17 may be contiguous with the boundary 16. In some embodiments, the entire boundary 16 is free of the parasitic channel suppression region 17 so that the boundary 16 has the same width as the mesa 14. In other embodiments, the central portion of the boundary 16 is free of the parasitic channel suppression region 17 and peripheral portions underneath, the side faces 18 of the mesa 14 include a parasitic channel suppression region 17.

In some embodiments, the parasitic channel suppression region 17 is positioned on at least one side face 18 of the mesa 14. In some embodiments, the parasitic channel suppression region 17 is positioned on both the sidewalls 18 of the mesa and laterally adjacent the mesa 14 in the non-device regions 24 at the first surface 12 of the support substrate 11, as illustrated in FIG. 1.

The parasitic channel suppression region 17 may include an amorphous region or layer, a polycrystalline region or layer, a high-defect density region or layer, a region of the mesa 14 or support substrate 11 which has a damaged crystalline structure, or a region of the side face 18 of the mesa 14 and the first surface 12 of the support substrate 11 which includes interstitial atoms or ions or charge traps. In some embodiments, the parasitic channel suppression region 17 further comprises implanted species, wherein implanted species comprise at least one of the group consisting of Ar, Kr, Xe, Ne, He, N, O, H, Fe, C, Si and Al.

The non-device regions 24 may be filled with insulating material 25 so that the side faces 18 of the mesa 14 in the semiconductor device 10 are embedded in the insulating material 25. The insulating material 25 may form a planar surface 26 with the upper surface 20 of the mesas 14. The insulating material 25 may be silicon dioxide.

In other embodiments, at least one cavity is arranged laterally adjacent to the mesa 14 in the non-device region 24, the cavity being defined by one or more insulating layers and being filled with a gas or vacuum. For example, the cavity can be defined by insulating layers arranged on the side faces 18 of adjacent mesas 14, the first surface 12 of the support substrate 11 arranged in the non-device regions 24 and be capped by a further insulating layer.

In FIG. 1, the epitaxial III-V semiconductor multi-layer structure 15 is an epitaxial Group III nitride-based multi-layer structure 15. However, in other embodiments, the epitaxial III-V semiconductor multi-layer structure 15 may include GaAs and the support substrate may be a silicon wafer.

Epitaxial Group III nitride-based multilayer structures, such as those described above which are used for HEMTs, have large polarization charges and are epitaxially grown at high temperature. Consequently, the inclusion of the parasitic channel suppression region 17 can be particularly beneficial for Group III nitride-based multi-layer structures 15 and in particular for Group III nitride-based devices grown on a silicon <111> or <110> wafer or a sapphire wafer or a SiC wafer or an epitaxial monocrystalline silicon layer or a highly resistive silicon wafer.

The epitaxial Group III nitride-based multi layer structure 15 may include a stack of epitaxial Group III nitride layers. For a High Electron Mobility Transistor (HEMT), the epitaxial Group III nitride-based multilayer structure 15 may include an epitaxial Group III nitride-based buffer structure on the first surface 12 of the support substrate 11, an epitaxial Group III nitride channel layer arranged on the Group III nitride buffer structure and a Group III nitride barrier layer arranged on the Group III nitride buffer structure. The Group III nitride barrier layer and the Group III nitride channel layer may be of differing composition and different bandgap is such that a hetero junction, which is capable of supporting a two-dimensional charge gas, is formed therebetween. The channel layer may include GaN and the barrier layer AlGaN.

The Group III nitride-based buffer structure for a silicon substrate may include an AlN starting layer, which, may have a thickness of several 100 nm, on the silicon substrate followed by a $Al_xGa_{(1-x)}N$ layer sequence, the thickness again being several 100 nm's for each layer, whereby the Al content of about 50-75% is decreased down to 10-25% before the GaN layer of AlGaN back barrier is grown. Alternatively, a superlattice buffer can be used. Again an AlN starting layer on the silicon substrate is used. Depending on the chosen superlattice, a sequence of AlN and $Al_xGa_{(1-x)}N$ pairs is grown, where the thickness of the AlN layer and $Al_xGa_{(1-x)}N$ is in the range of 5-15 nm. Depending on the desired breakdown voltage the superlattice may include between 20 and 100 pairs. Alternatively, an $Al_xGa_{(1-x)}N$ layer sequence as described above can be used in combination with the above mentioned superlattice.

A conductive electrode 27 may be arranged on the second surface 13 of the support substrate 11. The conductive electrode 27 may be coupled to ground potential.

The parasitic channel suppression region 17 is arranged to as to suppress mobility of charges in parasitic conductive channels from the drain electrode 23 to the electrode 27 on the rear surface 13 of the support substrate 11. These parasitic conductive channels may be formed at the interface between the insulating material 25 and the mesas 14, at the interface between the insulating material 25 and the support substrate 11 and at the boundary 16 between the Group III nitride structure 15 and the first surface 12 of the support substrate 11. The parasitic channel suppression region 17 is arranged laterally to the boundary 16 at the interface between the side faces 18 of the mesas 14 and the insulating material 25 and at the interface between the first surface 12 of the support substrate 11 and the insulating material 25.

In some embodiments, the parasitic channel suppression region 17 hinders or suppresses the mobility of charges present at the interface between the insulating material 25 and the support substrate and/or at the interface between the insulating material 25 and the side faces 18 of the mesa 14. This can be achieved by providing a parasitic channel suppression region 17 that is highly resistive so that charges are prevented or hindered from moving. In these embodiments, the parasitic channel suppression provides a charge mobility reduction region 17. The charge mobility reduction region 17 may include an amorphous layer or region, a polycrystalline layer or region or a high defect layer or region.

In some embodiments, the parasitic channel suppression region 17 hinders or suppresses the effects of a parasitic hole or electron channel by decreasing the charge density, for example by providing traps in the parasitic channel suppression region. As the charge density is decreased, there are fewer charges available to produce a parasitic current so that formation of a parasitic channel is suppressed.

In some embodiments, a combination of charge traps to reduce the charge density and means for hindering the flow of any free charges, such as a locally increased resistance provided by a polycrystalline, amorphous or defective crystal structure in the parasitic region 17, may be used to suppress parasitic channels.

FIG. 2, which includes FIGS. 2A to 2F, illustrates a method of fabricating a semiconductor device.

Figure 2A:
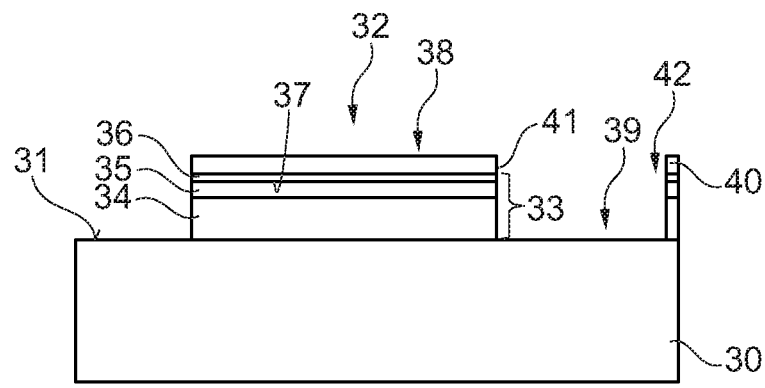

FIG. 2A illustrates a support substrate 30 having a first surface 31 capable of supporting the epitaxial growth of at least one Group III nitride layer. The support substrate 30 may include a may be a monocrystalline substrate such as a silicon <111> or silicon <110> wafer or a monocrystalline sapphire wafer or a silicon carbide wafer. The silicon substrate may be a high resistivity silicon substrate.

In FIG. 2, the fabrication of a single semiconductor device in a single component position 32 is illustrated. However, typically, the support substrate 30 has an area sufficient to support the fabrication of a plurality of semiconductor devices which are typically formed in a plurality of device positions arranged in rows and columns on the first surface 31.

A multilayer Group III nitride structure 33 is epitaxially grown on the first surface 31. The multilayer Group III nitride-based structure 33 may include a Group III nitride buffer structure 34 which is grown on the first surface 31, a Group nitride channel layer 35 which is grown on the Group III nitride buffer structure 34 and a Group III nitride barrier layer 36 which is grown on the Group III nitride channel layer 35. The Group III nitride barrier layer 36 may include aluminium gallium nitride and the Group III nitride channel layer 35 may include gallium nitride such that a heterojunction 37 is formed between the Group III nitride channel layer 35 and the Group III nitride barrier layer 36 which is capable of supporting a two dimensional charge gas.

The multilayer Group III nitride structure 33 may then be structured to produce a plurality of mesas 38 by removing regions 39 of the multilayer Group III nitride structure 33. For example, a mask 40 can be applied to the multi-layer Group III nitride structure 33 and structured to provide openings 41 exposing regions of the Group III nitride structure 33 which may then be removed, for example by etching, such that the first surface 31 of the support substrate 30 is revealed. Adjacent mesas 38 are then spaced apart by non-device regions 42 which define the mesas 38.

Figure 2B:
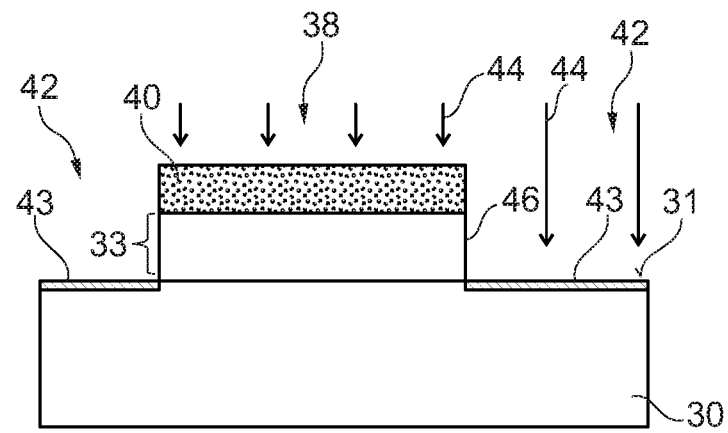
Figure 2C:
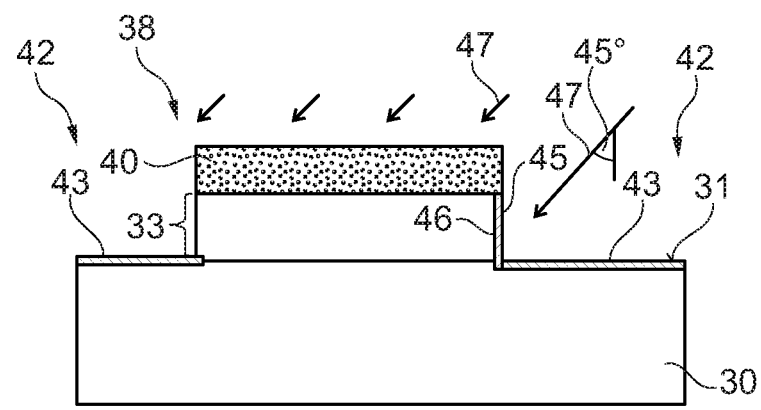

As is illustrated in FIG. 2B, a parasitic channel suppression region, in the form of a charge mobility reduction region 43, is formed at the first surface 31 of the support substrate 30 at a position laterally adjacent to the mesa 38 in the non-device region. 39 of the support substrate 30. In some embodiments, the charge mobility reduction region 43 is formed by implanting species, such as $Ar^+$ ions, into the first surface 31 of the substrate 30 at a position laterally adjacent to the mesa 38 as is schematically indicated in FIG. 2B by the arrows 44. The implanted species can comprise one of the group consisting of Ar, Kr, Xe, Ne, He, N, O, H, Fe, C, Si and Al. The upper surface of the mesa 38 is covered by the mask 40 and is not implanted with the species.

In some embodiments, a parasitic channel suppression region, in the form of a charge mobility reduction region 45, is also formed on side faces 46 of the mesa 38. The charge mobility reduction region 45 may be formed at the side faces 46 of the mesa 38 by implantation and, for example, by implantation, of one or more species at an inclined angle with respect to the side face 45 and first surface 31. The implantation of the species into the side face 46 is indicated schematically in FIG. 20 by the arrows 47. As an example, these species may be implanted at an angle of 45° to with respect to the side face 46 and first surface 31.

In some embodiments, the species may be implanted two or more different energies in order to increase the implantation depth and thickness of the charge mobility reduction region 43, 45. In particular example, the species are Ar+ ions, which are implanted at an energy in, the range of 20 keV to 250 keV with an implantation dose of $1e^{13}$ $cm^{-2}$ to $5e^{15}$ $cm^{-2}$ or $1e^{14}$ $cm^{-2}$ to $5e^{15}$ $cm^{-2}$. In one example, the species are implanted with an ion implantation, dose of $3e^{14}$ $cm^{-2}$ at 50 keV and $3e^{14}$ $cm^{-2}$ at 250 keV.

The charge mobility reduction regions 43, 35 may have a polycrystalline structure or an amorphous or a high-defect density structure. Alternatively, the charge mobility reduction regions 43, 45 may be replaced by charge density reduction regions including charge traps. The charge mobility reduction regions may consist of regions of high trap density, where electrons or holes occupy the traps. In this case the number of electrons or holes available for current conduction is reduced. The resistance of the charge mobility reduction regions 43, 45 is increased due to a reduction in the density of free electrons or holes at the interface. In some embodiments, a combination of a high trap density and a polycrystalline structure or an amorphous or a high-defect density structure is used.

Figure 2D:
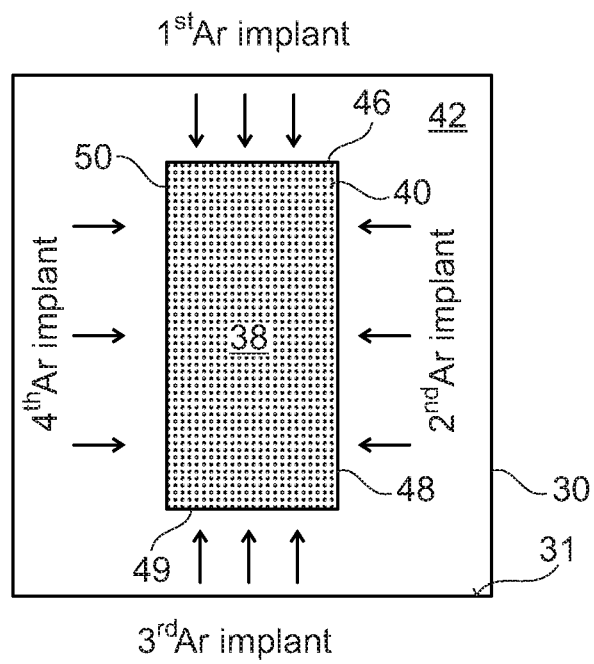

As illustrated in FIG. 2D, each side face 46 of the mesa 38 may be implanted separately and sequentially in order to produce a charge mobility reduction region on each of the four side faces of the mesa 38. In practice, since the support substrate 30 includes a plurality of discrete mesas 33 spaced apart by non-device regions 42 and the mesas 38 are arranged in a plurality of rows and columns, a particular side face, for example the side face 46 in FIG. 2D of each of the mesa 38 on the substrate 30 is implanted using a single implantation step. The relative orientation between the mesa 38 and the implantation beam being adjusted to implant further side faces 48, 49 and 50.

Figure 2E:
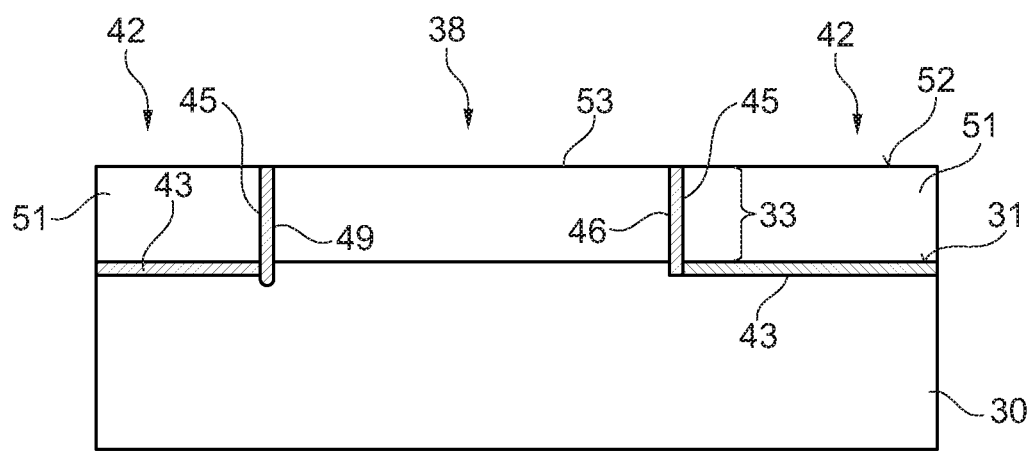

After the formation of the charge mobility reduction region or regions 43, 45, the non-device regions 42 may be filled with an insulation layer 51 as is illustrated in FIG. 2E to create a substantially planar upper surface 52 comprising material of the insulating material 51 and the upper surface 53 of the Group III nitride-based multilayer structure 33.

Figure 2F:
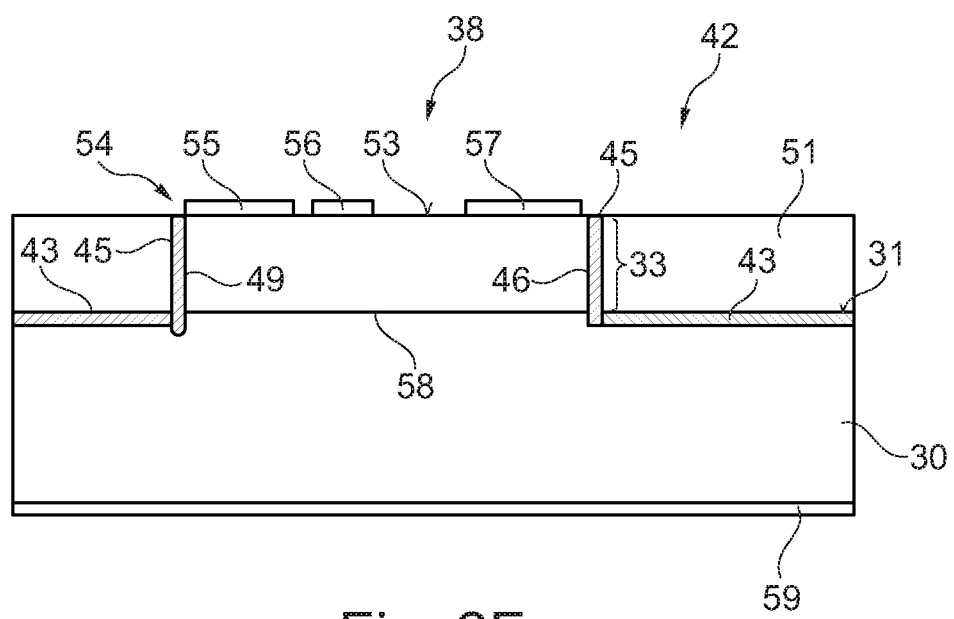

As is illustrated in FIG. 2F, the semiconductor device 54 may be completed by applying a metallisation structure to the upper surface 53 of the mesa 38 which, for a transistor device, may include a source electrode 55, a gate electrode 56 and a drain electrode 57 on each of the mesas 38. The semiconductor devices 54 may then be singulated from the wafer.

A boundary 58 is formed between the Group III nitride structure 33, in particular, the lowermost layer of the Group III nitride buffer structure 34 and the first surface 31 of the support substrate 30. An electrode 59 may be formed on the rear surface of the support substrate 30. The charge mobility reduction region or regions 43, 45 are arranged at the sides faces 46, 48, 49, 50 of the mesa 38 and at the first surface 31 of the substrate 30 in the non-device regions 42 and laterally adjacent the mesa 38 and the boundary 58 and serve to hinder the movement of charges formed at the interfaces between the side faces 46, 48, 49, 50 of the Group III nitride structure 33 and the insulating material 51, at the interface between the insulating material 51 and the first surface 31 of the support substrate 12 and at the boundary 58 between the Group III nitride structure 33 and the first surface 31 of the support substrate 30 and consequently RF losses due to the formation of parasitic conductive channels between the drain electrode 57 and the electrode 59 on the rear of the substrate 30.

FIG. 3, which includes FIGS. 3A to 3E, illustrates further embodiments of devices including a charge mobility reduction region.

Figure 3A:
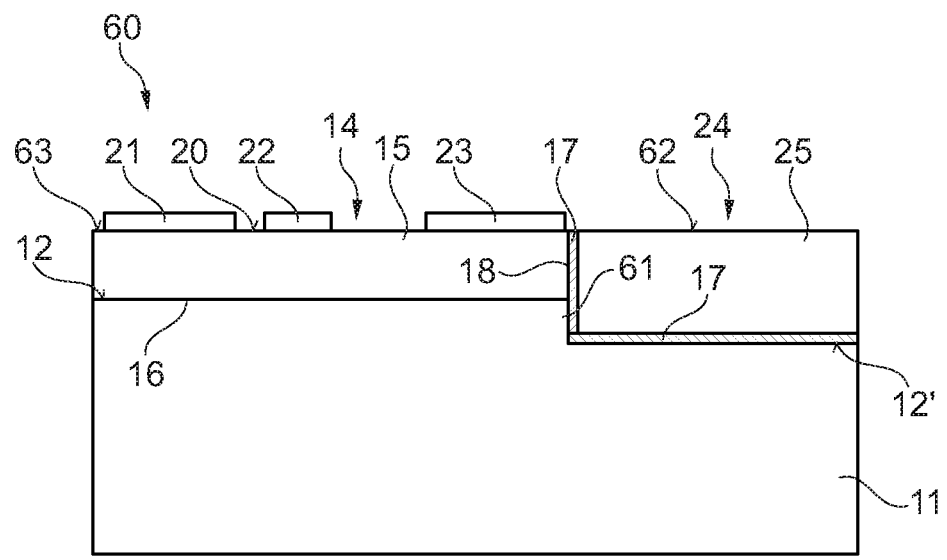

FIG. 3A illustrates a semiconductor device 60 according to an embodiment. The semiconductor device 60 includes a mesa 14 including an epitaxial Group III nitride-based multilayer structure 15 arranged on a first surface 12 of a support substrate 11 as in the embodiment illustrated in FIG. 1. The semiconductor device 60 also includes a charge mobility reduction region 17 which is positioned laterally adjacent the boundary 16 between the first surface 12 of the substrate 11 and the epitaxial Group III nitride-based modular structure 15. The charge mobility reduction region 17 is arranged on side faces 18 of the mesa 14 and in non-device regions 24 of the semiconductor device 60.

The charge mobility reduction region 17 provides a parasitic channel suppression region. In some embodiments, a charge density reduction region is used in addition to or in place of the charge mobility reduction region 17 to suppress parasitic channel formation or the effects of parasitic channels.

The semiconductor device 60 differs from, the Semiconductor device 10 illustrated in FIG. 1 in the vertical position of the boundary 16 and the charge mobility reduction region. 17 arranged in the non-device regions 24. In the semiconductor device 60, the boundary 16 between the epitaxial Group III nitride multilayer structure 15 and the first surface 12 of the support substrate 11 is positioned within the protruding portion of the mesa 14 and is arranged in a plane vertically above the plane of the charge mobility reduction region 17.

In some embodiments, such as the embodiment illustrated in FIG. 1, the first surface 12 is substantially planar in regions covered by the mesa 14 and in the non-device regions 24. In some embodiments, such as that illustrated in FIG. 3A, the semiconductor device 60 includes a support substrate 11 that comprises a worked first surface 12' in the non-device regions 24 that are unoccupied by the mesa 14. The boundary 16 between the first surface 12 of the support substrate 11 and the epitaxial Group III nitride-based multilayer structure 15 is arranged within the protruding portion of the mesa 14 and is spaced vertically a distance above the worked first surface 12'. In other words, the worked first surface 12' of the non-device region 24 is positioned in a plane below that of the boundary 16 so that a protruding portion is provided which includes the mesa 14 comprising the epitaxial Group III nitride-based multi-layer structure 15 and a raised portion 61 of the support substrate 11.

The non-device regions 24 are formed by removing portions of the Group III nitride-based multilayer structure 15 and a portion of the substrate 11 in the non-device regions to produce the worked first surface 12', which is positioned in a plane vertically lower than the plane of the first surface 12. The non-device region 24 may be filled with an insulating material 25 as in the embodiment illustrated in FIG. 1. The insulating material 25 may have an upper surface 62 that is coplanar with the upper surface 20 of the mesa 14 and form a planarized surface 63.

Figure 3B:
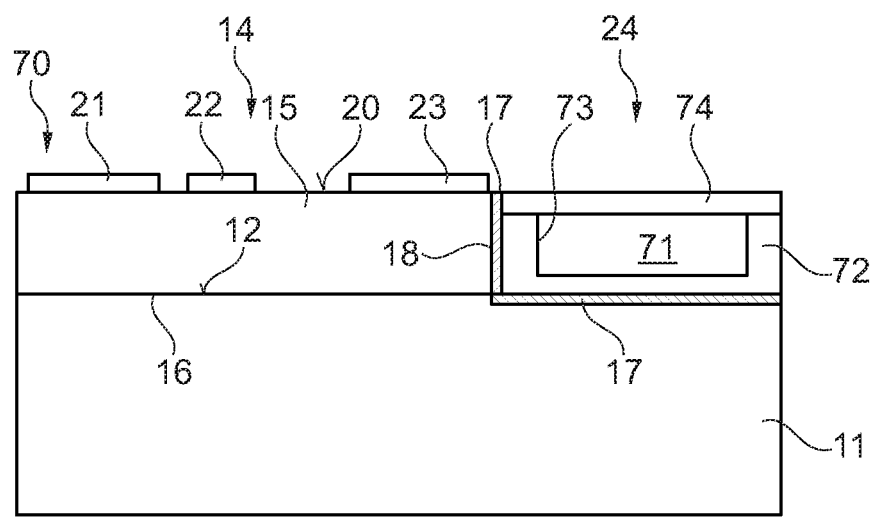

FIG. 3B illustrates a semiconductor device 70 including a mesa 14 including an epitaxial Group III nitride-based multi-layer structure 15 arranged on a first surface 12 of the support substrate 11, whereby the first surface 12 in regions under the mesa 14 and in the non-device region 24 is coplanar as in the embodiment illustrated in FIG. 1. In the embodiment illustrated in FIG. 3B, the semiconductor device 70 includes a cavity 71 in place of the insulating material 25 in the non-device region 24. The cavity 71 may be defined by an insulating layer 72 which lines the sidewalls and base of the non-device region 24 defined by the side faces 18 of the mesa 14 or charge mobility reduction region 11, if present, and the first surface 12 of the support substrate 11 or charge mobility reduction region 17, if present, which bounds a gap 73. The gap 73 is capped by a capping layer 74 to seal and entirely enclose the cavity 71. The cavity 71 may be filled by a gas or vacuum which may be the same or similar to the gas or vacuum present in the apparatus used to deposit the cap 74.

In some embodiments, the insulating layer 72 may extend to the upper surface. 20 of the mesa 14 and the cap layer 73 be positioned on the upper surface 20 and extend between two neighbouring the upper surfaces 20 of two neighbouring mesas 14.

Figure 3C:
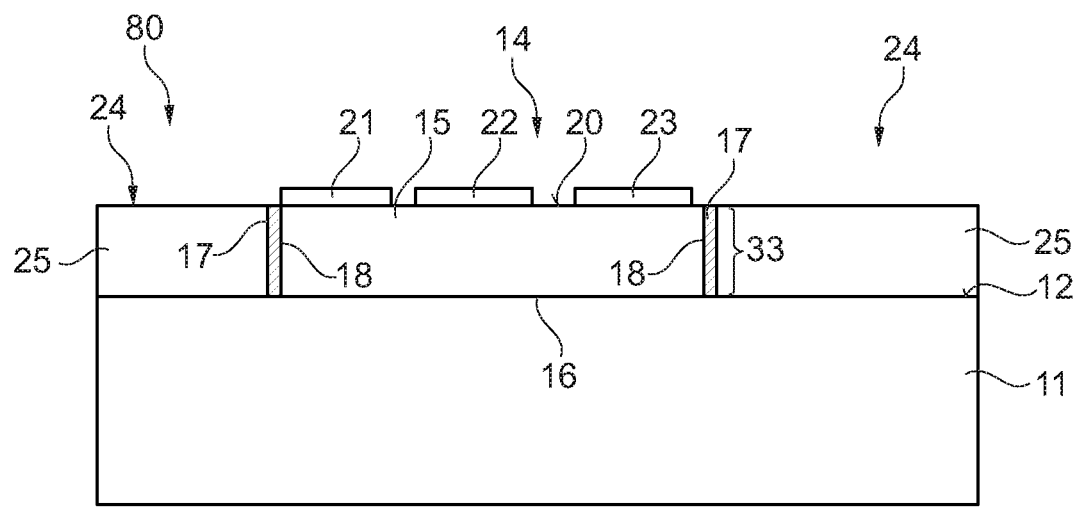

FIG. 3C illustrates a semiconductor device 80, which is similar to that illustrated in FIG. 1, but differs in that the charge mobility reduction layer 17 is arranged on only the side face 18 of the mesa 14 and the first surface 12 of the substrate 11 in the non-device area 24 remains free of the charge mobility reduction layer.

Figure 3D:
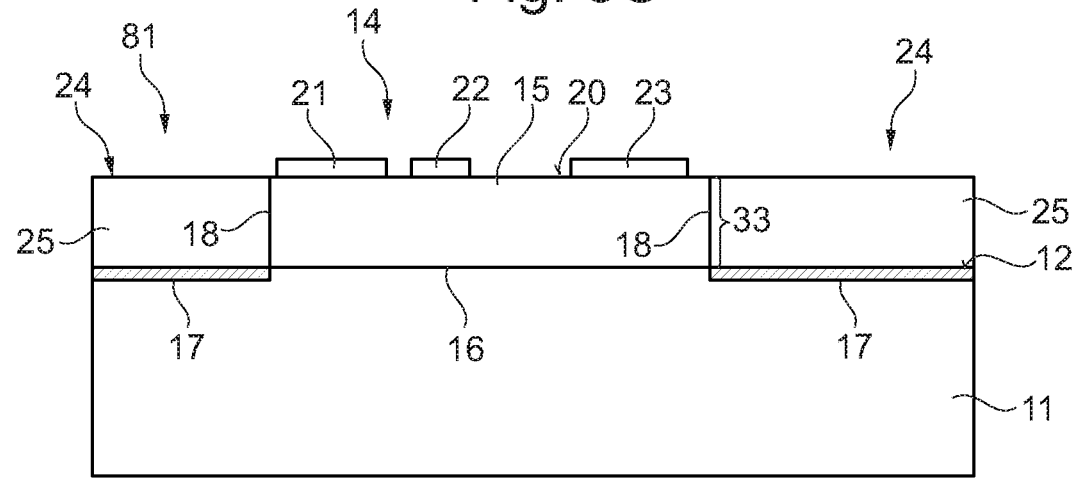

FIG. 3D illustrates a semiconductor device 81, which is similar to that illustrated in FIG. 1, but differs in that the charge mobility reduction layer 17 is arranged only on the first surface 12 of the substrate 11 in the non-device area 24 that the side faces 18 of the mesa 14 remain free of the charge mobility reduction layer.

Figure 3E:
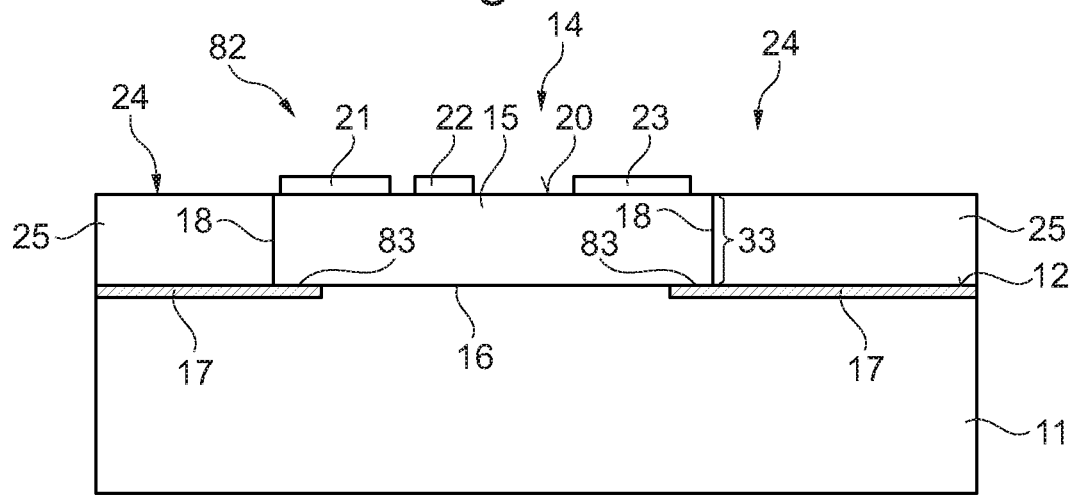

FIG. 3E illustrates a semiconductor device 82 which is similar to that illustrated in FIG. 1, but differs in that the charge mobility reduction layer 17 is arranged partially under the mesa 15 and at the peripheral edges 83 of the boundary 16 between the Group III nitride structure 33 and the first surface 12 of the support substrate 11. The charge mobility reduction layer 17 is arranged underneath the side faces 18 of the mesa 38. The charge mobility reduction layer 17 is also arranged at the first surface 12 of the substrate 11 in the non-device area 24. The side faces 18 of the mesa 14 remain substantially free of the charge mobility reduction layer 17.

In some embodiments, each mesa provides a single device, for example a transistor device for use in an application. In some embodiments, each mesa provides a substructure, for example a small area transistor device, which is coupled with other substructures to form a device.

In some embodiments, one or more mesas are provided which have no active or passive devices formed on or in the mesa. These mesa or mesas can be used to facilitate manufacture, e.g. by providing dummy mesa structures around the active mesa structures to aid uniform CMP (Chemical Mechanical Polishing) processing.

FIG. 4A illustrates a cross-sectional view and FIG. 4B a plan view of a portion of the semiconductor device 100 which includes a Group III nitride-based transistor device comprising a plurality of mesas 101 of which three are illustrated in the drawing. The mesas 101 are arranged on a first surface 102 of a support substrate 103. Each of the mesas 101 is spaced apart from its neighbour by a non-device region 104, whereby the non-device region 104 includes an insulating material 105. Each mesa 101 includes a multilayer Group III nitride structure 106.

The support substrate 103 may be a silicon monocrystalline substrate. In some embodiments, the multilayer group III nitride-based structure 106 includes a buffer structure arranged on the first surface 102 of the support substrate 103, a channel layer arranged on the buffer structure and a barrier layer arranged on the channel layer whereby the barrier layer and the channel layer comprise a Group III nitride of differing composition such that a hetero junction is formed between them that is capable of supporting a two dimensional charge gas. The channel layer may be formed of gallium nitride and the barrier layer may be formed of aluminium gallium nitride.

The upper surface 107 of the mesa 101 includes an elongate drain electrode 108 arranged towards the centre, two elongate gate electrodes 109, 110 arranged on opposing sides of the drain electrode 108 and two elongate source electrodes 111, 112 arranged at opposing peripheral edges of the mesa 101 and adjacent the gates 109, 110, respectively, so that the gate 109 is arranged between the source electrode 111 and the drain electrode 108 and the gate 110 is arranged between the drain electrode 108 and the source electrode 112. The drain electrode 108, gate electrodes 109, 110 and source electrodes 111, 112 extend substantially parallel to one another.

The drain electrodes 108 arranged on each of the mesas 101 are electrically coupled by means of a redistribution structure which includes a drain finger 113 arranged on top of the drain electrode 108 which extends along the length of the drain electrode 108 and onto a non-device region 104 arranged adjacent a first side face 114 of the mesas 101 and a drain runner 115 which electrically couples the drain fingers 113 to one another. The drain runner 115 extends perpendicularly to the drain fingers 113 and is arranged adjacent the first side face 114 of the mesas 101.

The gates 109, 110 arranged on the mesas 101 are electrically coupled to one another by means of a gate metallisation structure including gate fingers 116, 116' which are arranged on the gate electrodes 109, 110, respectively and extend onto the non-device areas 104 adjacent a second side face 117 of the mesa 101 which opposes the first side face 114. The gate fingers 116 are electrically connected together by a gate runner 118 which extends perpendicularly to the gate fingers 116 and substantially parallel to the drain finger 115. The gate runner 118 and the drain runner 115 are arranged on opposing lateral sides of the mesas 101.

The source electrode 111 is electrically coupled to the source electrode 112' on the neighbouring mesa 101' by a source connection 119 which extends over side faces 123, 124' of the mesas 101, 101' and onto the non-device area 104 positioned between the two immediately adjoining mesas 101, 101'. The source connections 119 are arranged laterally between the drain runner 115 and the gate runner 118. The semiconductor device 100 includes a conductive via 120 which is positioned in the non-device area 104 and extends through the insulating material 105 and the support substrate 103 to the rear surface 121 of the support substrate 103. The conductive via 120 is electrically coupled to a conductive layer 122 arranged on the rear surface 121 and to the conductive layer 119 extending between the source electrodes 111, 112 on the upper surface of the mesas 101, 101'. Consequently, the source electrodes 111, 112' which are positioned on two adjoining mesas 101, 101' and face one another and are electrically coupled to the layer 122 on the rear surface 121 of the support substrate 103 by means of the conductive layer 119 and the conductive via 120.

Each of the non-device regions 104 includes a parasitic channel suppression region in the form of a charge mobility reduction layer 125. The charge mobility reduction layer 125 is formed in the side faces 114, 117 123, 124, of the mesas 101 and in the upper surface 102 of the support substrate 103 in the non-device regions 104. The charge mobility reduction layer 125 is arranged laterally adjacent the boundary 126 between the Group III nitride structure 106 and the underlying upper surface 102 of the substrate 103.

The charge mobility reduction region 125 may be a highly resistive region which may be formed by forming an amorphous or polycrystalline region or high-defect density region at positions in which the parasitic electron channels are formed, for example at the side walls 114, 117, 123, 124 of the Group III nitride layers 106 of the mesas 101 and/or at the interface between the insulating material 105 and the substrate 103, for example at the first surface 102 of the substrate 103 in the non-device regions 104. The charge mobility reduction region 125 can be formed by implantation and local disruption the crystallinity of the substrate 103 and epitaxial Group III nitride layers 106. An increase in the drain efficiency of at least 4 to 5% can be achieved.

The charge mobility reduction layer 125 serves to suppress the current flow in the parasitic channels by inhibiting the movement of electrons in these parasitic channels and reduce RF losses and increase the efficiency of the device.

The parasitic electron channels are thought to still exit and be capacitively coupled to the drain electrode 108 and the electrode 122 on the rear surface of the substrate 103. However, the charge mobility reduction region 125 prevents current flow through the parasitic electron channel(s) so that RF losses do not arise.

In some embodiments, a charge density reduction region is used in addition to or in place of the charge mobility reduction region 125 to suppress parasitic channel formation or the effects of parasitic channels. A high trap density may be provided in the region 125 to reduce the charge density and as a consequence to reduce the current in the parasitic channels due to the reduction in the number of charges.

In some embodiments, the semiconductor device 100 may be a Monolithic Microwave integrated Circuit (MMIC) and include at least one transistor device and at least one passive device such as a capacitor, inductor or a transmission line that is integrated into the semiconductor device, for example under the mesa 101, in the non-device regions 104, on the upper surface or in the metallisation layer on the upper surface.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method of fabricating a semiconductor device, the method comprising:
   providing a substrate having a first surface capable of supporting the epitaxial growth of at least one III-V semiconductor layer,
   epitaxially growing a multilayer III-V semiconductor structure on the first surface,
   removing regions of the multilayer III-V semiconductor structure and producing at least one mesa,
   forming a parasitic channel suppression region at the first surface of the substrate laterally adjacent to the at least one mesa and/or on side faces of the at least one mesa, and
   applying an insulation layer to regions between the at least one mesa.

2. A method according to claim 1, wherein forming the parasitic channel suppression region comprises implanting species into the first surface of the substrate at a position laterally adjacent to the mesa and/or implanting species into at least one side face of the mesa.

3. A method according to claim 2, wherein the species comprise at least one of the group consisting of Ar, Kr, Xe, Ne, He, N, O, H, Fe, C, Si and Al.

4. A method according to claim 2, wherein the species are implanted at two or more different energies.

5. A method according to claim 1, further comprising:
   removing a portion of the first surface of the wafer adjacent the mesas to produce a worked first surface such that the boundary between the wafer and the multilayer III-V semiconductor structure is arranged in the mesa and at a distance above the worked first surface.

6. A method according to claim 1, wherein the III-V semiconductor is a Group III nitride, the method further comprising forming a metallization structure on the multilayer Group III nitride structure of the mesa, the metallization structure providing a source, gate and drain for a transistor structure.

7. A method of fabricating a semiconductor device, the method comprising:

providing a substrate having a first surface capable of supporting the epitaxial growth of at least one III-V semiconductor layer, epitaxially growing a multilayer III-V semiconductor structure on the first surface, removing regions of the multilayer III-V semiconductor structure and producing at least one mesa, forming a parasitic channel suppression region at the first surface of the substrate laterally adjacent to the mesa and/or on side faces of the at least one mesa, wherein the parasitic channel suppression region is disposed partially underneath the at least one mesa.

8. A method of fabricating a semiconductor device, the method comprising:

providing a substrate having a first surface capable of supporting the epitaxial growth of at least one III-V semiconductor layer, epitaxially growing a multilayer III-V semiconductor structure on the first surface, removing regions of the multilayer III-V semiconductor structure and producing at least one mesa, forming a parasitic channel suppression region at the first surface of the substrate laterally adjacent to the mesa and/or on side faces of the at least one mesa, wherein a thickness of the parasitic channel suppression region is less than a height of the at least one mesa, the height of the at least one mesa being a distance between the first surface and an upper surface of the at least one mesa opposite from the first surface, the thickness of the parasitic channel suppression being a distance between an inner surface of the parasitic channel suppression region that contacts the first surface an outer surface of the parasitic channel suppression region that is opposite from the inner surface.

9. A method according to claim 8, further comprising applying an insulation layer to regions between the at least one mesa, wherein the insulation layer comprises a planar surface that is coplanar with the upper surface of the at least one mesa.

\* \* \* \* \*